United States Patent [19]

Stewart

[11] Patent Number: 4,684,887
[45] Date of Patent: Aug. 4, 1987

[54] HIGH VOLTAGE TEST CONFIRMATION APPARATUS

[75] Inventor: Jimmy L. Stewart, Leesport, Pa.

[73] Assignee: General Battery Corporation, Reading, Pa.

[21] Appl. No.: 877,886

[22] Filed: Jun. 24, 1986

[51] Int. Cl.[4] .................. G01R 31/00; G08B 21/00
[52] U.S. Cl. .................. 324/158 R; 324/126;
340/659; 340/660; 340/664
[58] Field of Search ........... 324/158 R, 126, 73 AT;
340/664, 660, 659; 364/483; 307/234, 358, 510,
518; 318/109, 120; 377/20

[56] References Cited

U.S. PATENT DOCUMENTS 3,767,860 10/1973 Brown .................. 328/109 X
4,247,848 1/1981 Kitta et al. .................. 340/659 X
4,494,067 1/1985 Barszczewski .................. 324/83 D Primary Examiner—Reinhard J. Eisenzopf
Assistant Examiner—Vinh P. Nguyen
Attorney, Agent, or Firm—Benasutti & Murray

[57] ABSTRACT

An apparatus, for use in conjunction with a high voltage tester, for confirming that the high voltage test has been successfully completed. The apparatus detects currents caused by the application of a high test voltage to an article under test. If the detected current is not present throughout a predetermined test time interval, the apparatus provides a retest indication and alarm, signifying that a malfunction in the test has occurred. If the current is detected throughout the predetermined time period, a test complete indicator is activated, signifying the successful completion of the high voltage test.

10 Claims, 1 Drawing Figure

HIGH VOLTAGE TEST CONFIRMATION APPARATUS

BACKGROUND OF THE INVENTION

This invention relates to apparatus for performing high voltage testing and more particularly to apparatus for confirming that the test voltage has been properly applied to the test article for at least a predetermined minimum time period.

A high voltage or hi-pot test is commonly performed by applying a voltage of predetermined magnitude between two parts which are electrically insulated from each other in order to determine that minimum standards of the quality of electrical insulation between those parts exists. For example, during the manufacture of lead acid electric storage batteries, cell groups are hi-pot tested to verify that the separators, which provide electrical insulation between the positive and negative plates of the cell group, are properly installed and functioning. The hi-pot test typically involves applying a high voltage, for example 3000 volts, across the positive and negative plates for a predetermined minimum amount of time. An arc appearing between the positive and negative plates indicates a defective separator. If no arc appears within the predetermined minimum high voltage application period, the separators are deemed to be installed and functioning correctly.

The nature of hi-pot testing demands that the high voltage be applied between the insulated parts for at least a predetermined period of time. This insures adequate stressing of the insulating material by the applied high voltage in order to cause a break down of weak or defective regions. Such breakdown is manifested by arcing. If the high voltage is applied for less than the predetermined minimum amount of time, it is possible that a weakened or defective region of the insulation will not have time to breakdown; therefore, it will appear to the test conductor that the test results are normal even though such weakened or defective areas in fact exist.

High voltage test apparatus detects defects in electrical insulating media by sensing an increase in current through the media which, as previously stated, is caused by arcing. Such increase in current will cause the apparatus to sound an alarm, and/or in the case of an automatic test apparatus, to activate a reject cycle. It should be noted, however, that such apparatus will not detect malfunctions in the test equipment itself, for example: defective test leads; or an applied voltage of insufficient magnitude; or an absence of applied voltage altogether. Such apparatus will also not detect other malfunctions such as test probes which do nor properly contact the article under test. If one or more of these malfunctions occur, the required test voltage will not be applied to the test article. Consequently, weakened or defective areas in the insulating material will not be stressed, and arcing, which causes rejets to be detected, will not occur. As a result, defective articles will be passed on as acceptable.

Summary of the Invention

Accordingly, it an object of the present invention to provide an apparatus for confirming that the high test voltage is applied to the article under test for the minimum required time period.

It is another object of the present invention to provide a high voltage test confirmation apparatus which will detect a missing or abnormally low test voltage.

It is further object of the present invention to provide a high voltage test confirmation apparatus which will detect the existence of defective test leads or test probes.

It is still another object of the present invention to provide a high voltage test confirmation apparatus which will detect a misaligned test probe.

These and other objects of the present invention are realized by providing an apparatus which detects currents caused by the application of a high test voltage to an article under test. If the detected current is not present for a predetermined amount of time, the apparatus provides a retest indication and alarm. If the current is detected throughout the predetermined time period, a test complete indicator is activated. The apparatus provides a testing indicator as long as the current is being sensed during the predetermined test period. If the test leads are defective, or if the test probe has been misaligned with respect to the test article, or if the test voltage disappears or is reduced below a minimum threshold, the current will not be sensed. If such malfunctions occur prior to the start of the test, neither the testing indicator nor the test complete indicator will function, thereby alerting the operator that the test was not successfully performed. If the malfunction occurs during the test, the sensed current will cease, thereby causing the retest alarm to activate. If the malfunction continues following initiation of the retest, neither the testing nor test complete indicators will activate, thereby alerting the operator that the retest was not successfully performed.

DETAILED DESCRIPTION OF THE PREFERRED EMBODIMENT

Figure 1:
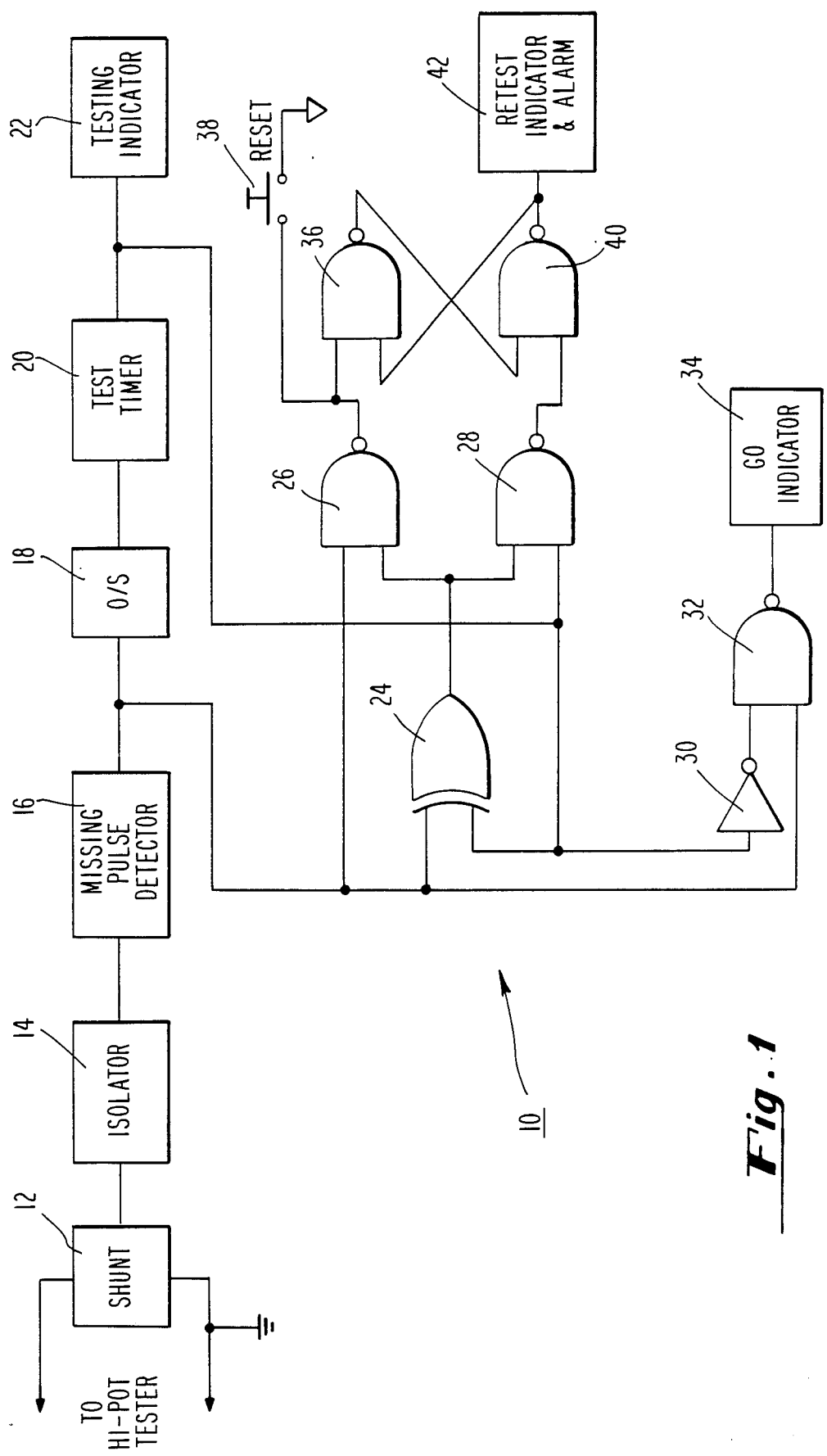
FIG. 1 is a block diagram of a preferred embodiment of the high voltage test confirmation apparatus of the present invention.

Referring now to FIG. 1, there is shown a block diagram of the high voltage test confirmation apparatus of the present invention, generally designated 10. The apparatus 10 comprises a shunt 12 which is connected to a hi-pot tester (not shown). The hi-pot tester provides a high test voltage, for example 3,000 volts, to the article under test. The purpose of the shunt 12 is to reduce the voltage to the isolator 14 to a safe level while measuring current. The shunt 12 comprises a resistor which is connected in series with the high test voltage return path provided by the high voltage return lead of the hi-pot tester. In the preferred embodiment, one terminal of the shunt 12 is electrically connected to a jack (not shown) and the other terminal is electrically connected to a plug via a test lead (not shown). The jack of the apparatus is adapted to matingly receive a plug attached to a lead from the high voltage return test probe of the tester. The plug of the apparatus is adapted to matingly engage a high voltage return jack on the tester. The shunt resistor is preferably an 11 ohm 5 watt precision resistor.

The input of an isolator 14 is electrically connected across the shunt 12. For the sake of simplicity and clarity, FIG. 1 is a one line diagram which does not show the signal return path. In the preferred embodiment, the isolator is connected to the shunt by means of two electrical conducters, each of which is connected to one terminal of the shunt resistor 12. In the preferred embodiment, the input of the isolator 14 is a General Electric Company type H11G2 photon coupled isolator, as shown and described in Bulletin No. 55.130, published March, 1979 by the General Electric Company, Semiconductor Products Department, West Genesse Street, Alburn, N.Y. 13021, which publication is incorporated by reference in this specification as if fully set forth herein. The function of the isolator 14 is to provide electrical isolation between the hi-pot tester and the remainder of the apparatus 10.

The output of the isolator 14 is electrically connected to the input of missing pulse detector 16. In the preferred embodiment, the missing pulses detector 16 is a National Semiconductor type LM556 Dual Timer as shown and described on pages 9-29 and 9-30 of the Linear Data Book published June, 1976 by National Semiconductor Corporation, 2900 Semiconductor Drive, Santa Clara, Calif. 95051, which publication is incorporated in this specification by reference, as if fully set forth herein. Upon detection of an initial input pulse, having an amplitude which exceeds a predetermined minimum magnitude, an output signal from the missing pulse detector will change state from low to high. If the missing pulse detector 16 detects the next input pulse before the expiration of a predetermined pulse delay time period, the output signal will remain high. If the pulse delay time period expires before the detection of the next input pulse, having an amplitude which exceeds the predetermined minimum magnitude, the output signal will change state from high to low. The convention for logic states utilized in this detailed description is that a logical high (or one) is +5 V and a logical low (or zero) is 0 V.

The output from the missing pulse detector 16 is connected to the input of a one shot 18. In the preferred embodiment, the one shot 18 is a capacitor (preferably having a capacitance of 0.005 microfarad), a first terminal of which is electrically connected to a positive voltage supply (preferably 5 volts) through a first resistor (preferably having a resistance of 1000 ohms), and a second terminal of which is electrically connected to the positive voltage supply through a second resistor (preferably having a resistance of 10,000 ohms). The first terminal of the one shot capacitor is electrically connected to the collector of a transistor (preferably a type 2N2222). The emitter of the transistor is electrically connected to ground. The output signal from the missing pulse detector 16 is applied to the base of the transistor. A high output signal from the missing pulse detector 16 will switch the transistor on, thereby causing a one shot output, which comprises a ground pulse having a predetermined duration (for example one microsecond), to appear at the second terminal of the one shot capacitor. If desired, a second capacitor (preferably having a capacitance of 0.1 microfarad) can be electrically connected between the first terminal of the one shot capacitor and ground for noise reduction.

The output of the one shot 18 is connected to the input of an adjustable test time 20. In the preferred embodiment, the test timer 20 is a National Semiconductor Corporation type LM555 timer, as shown and described on pages 9-23 through 9-28 of the aforementioned Linear Data Book published June, 1976 by National Semiconductor Corporation, which publication has been incorporated herein by reference. An output signal from the test timer 20 will change state from low to high upon detection of an input pulse from the one shot 18. The output signal from the test timer 20 will remain high for the duration of a predetermined test time interval, which interval is adjustable by means a ten turn potentiometer (not shown) in the preferred embodiment. At the end of the predetermined test time interval, the output signal from the adjustable test timer 20 will change state from high to low. The output of the adjustable test timer 20 is electrically connected to a "testing" indicator 22. In the preferred embodiment, the "testing" indicator 22 is a light emitting diode (LED), which provides a visual indication that a test is in progress.

The output signal from the missing pulse detector 16 is also connected to one input of a two-input exclusive OR gate 24. In the preferred embodiment, the two-input exclusive OR gate 24 is one of the OR gates of a Texas Instruments type SN7486 "Quadruple 2-Input Exclusive-OR Gates", integrated circuit as shown and described on pages 7-65 and 7-66 of the TTL Data Book for Design Engineers, Second Edition, published by the Engineering Staff of Texas Instruments Incorporated the Semiconductor Group, which publication is incorporated by reference as if fully set forth herein. The output signal from the missing pulse detector 16 is also connected to one input of a first two-input NAND gate 26. In the preferred embodiment, the first two-input NAND gate 26 comprises one of the two-input NAND gates of a Texas Instruments type SN7400 "Quadruple 2-Input Positive-NAND Gates" integrated circuit as shown and described in the aforementioned TTL Data Book for Design Engineers, which has been incorporated herein by reference. The output of the exclusive OR gate 24 is connected to the second input of the first two-input NAND gate 26 and one input of a second two-input NAND gate 28. In the preferred embodiment, the second two-input NAND gate 28 is one of the two-input NAND gates of the type SN7400 "Quadruple 2-Input Positive-NAND Gates" integrated circuit described above.

The output signal from the adjustable test timer 20 is also connected to the second input of the second two-input NAND gate 28; the second input of the exclusive OR gate 24 and the input of an inverter 30. In the preferred embodiment, the inverter 30 comprises a two-input NAND gate connected as an inverter as is known in the art. The two-input NAND gate is preferably one of the two-input NAND gates of a type SN7400 "Quadruple 2-Input Positive-NAND Gates" intergrated circuit described above. The output of the inverter 30 is connected to one input of a third two-input NAND gate 32. In the preferred embodiment, the third two-input NAND gate 32 is one of the two-input NAND gates of a type SN7400 "Quadruple 2-Input Positive-NAND Gates" integrated circuit described above. The output signal from the missing pulse detector 16 is also connected to the second input of the third two-input NAND gate 32. The output of the third two-input NAND gate 32 is conencted to a test complete or "GO" indicator 34. In the preferred embodiment, the "GO" indicator 34 comprises a light emitting diode (LED), which provides a visual indication that the test has been successfully completed. In addition to the LED, the "GO" indicator 34 may also include a reed relay having normally open contacts which will close when the output of the third two-input NAND gate 32 changes state from high to low. The contacts of the reed relay are thus available to provide a test complete signal to other associated equipment.

The output of the first two-input NAND gate 26 is electrically connected to one input of a fourth two-input NAND gate 36. In the preferred embodiment, the fourth two-input NAND gate 36 is one of the two-input NAND gates of a type SN7400 "Quadruple 2-Input Positive-NAND Gates" integrated circuit described above. A normally open, momentary single pole push button "RESET" switch 38 is also connected to the first input of the fourth two-input NAND gate 36. The other terminal of the "RESET" switch 38 is connected to ground. The output of the fourth two-input NAND gate 36 is electrically connected to a first input of a fifth two-input NAND gate 40. The fifth two-input NAND gate 40 is preferably one of the two-input NAND gates of a type SN7400 "Quadruple 2-Input Positive-NAND Gates" integrated circuit described above. The output of the second two-input NAND gate 28 is electrically connected to the second input of the fifth two-input NAND gate 40. The output of the fifth two-input NAND gate 40 is electrically connected to the second input of the fourth two-input NAND gate 36 and a retest indicator and alarm 42. In the preferred embodiment, the retest indicator is a light emitting diode which provides a visual indication that a retest is required. The retest alarm comprises a relay having normally open contacts which are closed upon activation of the relay and which provides switching means for use by a remotely positioned alarm device and/or associated equipment (not shown).

The apparatus 10 of the present invention operates as follows. The apparatus 10 preferably operates in conjunction with a hi-pot tester which applies a pulsed DC waveform consisting of high voltage, high current pulses of very short time duration. In the preferred embodiment, such a tester is a Slaughter Model A648/018 which applies pulses at the rate of 60 pulses per second when utilizing a 60 Hz power source or 50 pulses per second when utilizing a 50 Hz power source. The duration of each pulse is approximately 10 microseconds. Although the instantaneous energy in each pulse is high, the short duration of the pulses result in a relatively low average energy level. Therefore, the high voltage stress required to obtain a good test is produced without the necessity of providing a high power tester and the problem of producing excessive heat within the article under test. One example of an article under test for which the apparatus 10 is useable is a group of positive and negative battery plates which are electrically insulated from each other by separators. The plug attached to the lead from the high voltage return test probe of the Slaughter tester is inserted into the apparatus jack. The apparatus plug is then inserted into the high voltage return jack on the Slaughter tester. This places the shunt 12 in electrical series with the high voltage return path of the Slaughter tester.

Since the shunt 12 is connected in electrical series with the high voltage return of the Slaughter tester, a leakage current will flow through the shunt 12 when the test probes are properly aligned and contacting the test article. This leakage current will cause relatively low voltage pulses to appear across the shunt 12. Thse low voltage pulses occur at the same repetition rate and for the same duration as the high voltage pulses. The low voltage pulses are coupled to the isolator 14 which produces isolated output pulses having the same repetition rate and duration as the high voltage pulses. These isolated output pulses are used to trigger the input of the missing pulse detector 16. As indicated above, receipt of the first pulse whose amplitude exceeds the predetermined minimum magnitude, causes the output signal from the missing pulse detector 16 to change from a low state (0 volts) to a high state (+5 volts). Retriggering the input of the missing pulse detector 16, by a pulse whose amplitude exceeds the predetermined minimum magnitude, before the predetermined pulse delay time period has expired, will cause the output signal from the missing pulse detector 16 to remain high. In the preferred embodiment, the predetermined pulse delay time period is set by the time constant of a 47K ohm resistor and a 0.002 microfarad capacitor.

A change of state from low to high of the output signal from the missing pulse detector 16 causes the one shot 18 to generate a pulse which causes the start of the predetermined test time interval of the test timer 20. During the test time interval, the output signal from the test timer 10 will remain high. As indicated above, the length of the test time interval is adjustable by means of a 10 turn potentiometer, having a total resistance of 10K ohm in the preferred embodiment, in conjunction with a capacitor, which in the preferred embodiment has a value of 100 microfarads. A high output signal from the adjustable test timer 20 will cause the "testing" indicator LED 22 to illuminate, indicating that the test is in progress.

At the conclusion of the test time interval, the output signal from the test timer 20 will change state from high to low. This will cause a high signal to appear at one of the inputs of the third two-input NAND gate 32 since the output of the test timer is connected to that input through the inverter 30. Since the missing pulse detector 16 is still receiving pulses from the isolator 14, the output signal from the missing pulse detector 16 will remain high. This high output signal is applied to the other input of the third two-input NAND gate 32.

Since the output of a two-input NAND gate will be low if the signals at both inputs are high, the output of the third two-input NAND gate 32 at this point will be low which will cause the "GO" indicator LED 34 to illuminate. As previously stated, the GO indicator 34 preferably also includes a reed relay having normally open contacts which will close when the output of the third two-input NAND gate 32 changes state from high to low. This provides the availability of a set of switch contacts which close upon completion of the test and which may be utilized by other equipment as an indicator of the successful completion of the hi-pot test.

Assuming now the situation where a default occurs during the test time interval. For example, the operator mistakenly removes the test probe from the article under test prior to the completion of a test time interval; or a malfunction occurs in the hi-pot test equipment, for example, a break in the high voltage leads or a short in the output; or the output voltage falls below a predetermined magnitude. Since this has occurred during the test time interval, the output signal from the adjustable test timer 20 will still be a logical high and the "testing" indicator 22 will remain illuminated. However, since the application of the high voltage pulses to the article under test has terminated due to the malfunction, the pulses across the shunt 12 and consequently the isolated pulses from the isolator 14 applied to the input of the missing pulse detector 16 will cease. If they are not resumed before the expiration of the predetermined pulse delay time period, the output signal from the missing pulse detector will change state from high to low.

At this point, the signals applied to the inputs of the two-input exclusive OR gate 24 are a low and a high. As a result, the output from the exclusive OR gate 24 is a logical high. Consequently, the signals appearing at the inputs of the second two-input NAND gate 28 are both high. This causes a signal having a logical low state to be applied to one input of the fifth two-input NAND gate 40. This in turn causes the output of the fifth two-input NAND gate 40 to assume a high state which causes the retest indicator LED to illuminate and the retest alarm relay to be activated.

Upon expiration of the predetermined test time interval, the output signal from the test timer 20 will change state from high to low, causing the two signals at the inputs of the exclusive OR gate 24 to change state from a high and a low to both low. This causes the output of the exclusive OR gate 24 to change state from high to a low. This in turn causes the inputs to the second two-input NAND gate 28 to be both low which then causes the output from the second NAND gate 28 to be low. Likewise, the two-input signals to the first two-input NAND gate 26 are both low which causes the output of the first NAND gate 26 to be high. Since the output of the fifth two-input NAND gate 40 is high, as indicated above, the two-inputs to the fourth two-input NAND gate 36 are each high causing the output of the fourth NAND gate 36 to be low. Since this is applied to one input of the fifth two-input NAND gate 40, the output of the fifth NAND gate 40 will remain high which will cause a continuation of the retest indicator and alarm signal 42.

To reset the retest indicator and alarm 42, the reset button 38 is depressed which causes a signal having a low state (0 V) to appear at one input of the fourth two-input NAND gate 36. This causes the output of the NAND gate 36 to be high which now results in both input signals to the fifth two-input NAND gate 40 to be high. This causes the output of the fifth NAND gate 40 to be a low which terminates the retest indicator and alarm 42. The retest indicator and alarm 42 may also be reset by successfully initiating retest. For example, a proper retest will cause leakage current to flow through the shunt 12 which in turn causes isolated pulses to be coupled to the input of the missing pulse detector 16 from the isolator 14. This causes the output signal from the missing pulse detector 16 to change state from low to high. This high signal is applied to one input of the two-input exclusive OR gate 24.

At the time of application of this high signal, the other input of the two-input exclusive OR gate 24 is a low since it is connected to the output of the test timer 20. As stated previously, the output signal from the test time 20 will remain low until triggered by the one shot 18. As a result, the output of the two-input exclusive OR gate 24 is high at this time and is applied to one input of the two-input NAND gate 26. The other input to the first NAND gate 26 is the output signal from the missing pulse detector 16 which, as previously stated, is now high. Since both inputs of the first two-input NAND gate 26 are high, the output will be low. This low signal is coupled to the same input of the fourth two-input NAND gate as is the reset button 38. Consequently, a low signal applied to this input of the fourth two-input NAND gate 36 will cause the retest indicator and alarm 42 to terminate in the same manner as previously described with respect to depressing the reset button 38.

As can be seen from the above detailed description, the high voltage test confirmation apparatus of the present invention will insure that the high voltage or hi-pot tester is operating correctly and that a malfunction has not occurred such as a misaligned test probe; a cessation of the output voltage from the hi-pot tester; or a defect in the high voltage leads and/or test probes themselves. If a malfunction occurs, the testing indicator will not be illuminated, thereby alerting the operator that a problem exists. In addition, if a malfunction occurs during the test interval; for example, the operator removes the test probe too soon; the voltage output from the hi-pot tester ceases for whatever reason; a break occurs in the test leads; etc., the retest indicator and alarm will be activated thereby alerting the operator that a malfunction has occurred during testing. In such case, the operator could attempt a retest by continuing the test. A successful retest will automatically reset the retest indicator and alarm. The operator could alternatively reset the retest indicator and alarm by depressing the reset button and attempt to perform the test again. If the test proceeds normally, the previous malfunction can be considered to be transient and a successful completion will be indicated by the activation of the GO indicator.

Another advantage of the preferred embodiment of the present invention is that it can be used with existing high voltage testers without physically modifying such testers. This is possible since the preferred embodiment of the apparatus of the present invention may be connected in electrical series with the high voltage return line of the high voltage tester by simply plugging the high voltage return probe of the high voltage tester into the receiving jack of the apparatus of the present invention; and inserting the plug from the apparatus into the voltage return jack on the tester. This obviates the necessity of making internal modifications to the high voltage tester which, in many cases, might invalidate the manufacturer's warranty and/or which could detrimentally alter the operation and performance of the tester.

While the invention has been described primarily in terms of the specific preferred embodiment, it is not limited thereto, but rather only to the extent set forth hereafter in the claims which follow.

I claim:

1. A high voltage test confirmation apparatus comprising:
   (a) means for detecting the magnitude of a test current flowing through an article under test as a result of application to said article of a test voltage having a predetermined magnitude, and for providing a first signal which commences upon detection of a test current magnitude which exceeds a predetermined value and which terminates when said magnitude falls below said predetermined values;
   (b) means for providing a second signal which commences upon commencement of said first signal and which terminates upon expiration of a predetermined test time interval;
   (c) means for providing a test complete signal when said second signal terminates before said first signal; and
   (d) means for providing a retest signal when said first signal terminates before said second signal.

2. An apparatus in accordance with claim 1 wherein said test voltage and resultant test current each comprises a pulsed direct current waveform and said means for detecting the magnitude of said test current and for providing said first signal comprises:

(i) a shunt connected in electrical series with a test voltage return path;

(ii) isolation means, electrically connected to with said shunt, for providing electrical isolation from said test voltage and test current; and (iii) missing pulse detection means, electrically connected to said isolation means, for initiating said first signal upon receipt of a pulse having an amplitude which exceeds a predetermined magnitude, and for terminating said first signal if another such pulse is not received within a predetermined pulse delay time period.

3. An apparatus in accordance with claim 1 wherein said means for providing a test complete signal comprises:

(i) inverter means having an input for receiving said second signal, and an output;

(ii) NAND gate means, having two-inputs and an output, one of said inputs being electrically connected to the output of said inverter means and the other input for receiving said first signal; and (iii) indicator means electrically connected to the output of said NAND gate means.

4. An apparatus in accordance with claim 3 wherein said indicator means comprises a light emitting diode.

5. An apparatus in accordance with claim 4 wherein said indicator means additionally comprises a relay.

6. An apparatus in accordance with claim 1 wherein said means for providing a retest signal comprises:

(i) a first two-input NAND gate having an output, a first one of said inputs for receiving said first signal;

(ii) a two-input exclusive OR gate having an output, a first one of said inputs for receiving said first signal, a second one of said inputs for receiving said second signal, and said output electrically connected to a second one of the inputs of said first two-input NAND gate;

(iii) a second two-input NAND gate having an output, a first one of said inputs being electrically connected to the second input of the first two-input NAND gate and the output of said two-input exclusive OR gate, and a second one of said inputs adapted to receive the second signal;

(iv) a third two-input NAND gate having an output, a first one of said inputs electrically connected to the output of said first NAND gate;

(v) a fourth two-input NAND gate having an output, a first one of said inputs electrically connected to the output of said third two-input NAND gate, the second one of said inputs electrically connected to the output of said second two-input NAND gate, and the output electrically connected to the second input of the third two-input NAND gate; and (vi) a retest indicator and alarm electrically connected to the output of the fourth two-input NAND gate.

7. An apparatus in accordance with claim 6 wherein said retest indicator and alarm comprises a light emitting diode.

8. An apparatus in accordance with claim 7 wherein said retest indicator and alarm additionally comprises a relay.

9. An apparatus in accordance with claim 6 additionally comprising means for manually resetting said apparatus.

10. An apparatus in accordance with claim 9 wherein said manual reset means comprises a momentary push button having a first terminal electrically connected to the first input of said third NAND gate and a second terminal electrically connected to a signal return.

* * * * *

UNITED STATES PATENT AND TRADEMARK OFFICE
CERTIFICATE OF CORRECTION

PATENT NO. : 4,684,887

DATED : August 4, 1987

INVENTOR(S) : Jimmy L. Stewart

It is certified that error appears in the above-identified patent and that said Letters Patent is hereby corrected as shown below:

In column 9, line 6, the word "with" should be deleted.

Signed and Sealed this

Eighth Day of March, 1988

Attest:

DONALD J. QUIGG

*Attesting Officer*     *Commissioner of Patents and Trademarks*